US006920583B1

(12) United States Patent
Morley et al.

(10) Patent No.: US 6,920,583 B1
(45) Date of Patent: Jul. 19, 2005

(54) SYSTEM AND METHOD FOR COMPILING TEMPORAL EXPRESSIONS

(75) Inventors: Matthew John Morley, Saratoga, CA (US); Yaron Kashai, Sunnyvale, CA (US)

(73) Assignee: Verisity Ltd., Rosh HaAyin (IL)

( * ) Notice: Subject to any disclaimer, the term of this patent is extended or adjusted under 35 U.S.C. 154(b) by 699 days.

(21) Appl. No.: 09/880,889

(22) Filed: Jun. 15, 2001

(51) Int. Cl.[7] ............................................. G06F 11/00
(52) U.S. Cl. ............................................ 714/32; 716/5
(58) Field of Search ............................ 714/26, 27, 32, 714/33, 37, 741; 716/5

(56) References Cited

U.S. PATENT DOCUMENTS 6,182,258 B1    1/2001   Hollander

OTHER PUBLICATIONS

Felder, Miguel and Moraenti, Angelo "Validating Real–time systems by history–checking TRIO Specifications" ACM 1994.*

Yoon, Wan C. "Qualitative Modeling with Temporal Causality Network and Quantity Network" IEEE 1989.*

Beer et al, "Rule Base: an Industry–Oriented Formal Verification Tool", Proc. DAC, ACM, Jun., 1996.

Clarke et al, "Another Look at LTL Model Checking", Proc. Of Computer–Aided Verification, Springer–Verlag, 1994.

* cited by examiner

Primary Examiner—Bryce P Bonzo
(74) Attorney, Agent, or Firm—G.E. Ehrlich (1995) Ltd.

(57) ABSTRACT

A system and method for enabling the behavior of temporal expressions to be analyzed for the evaluation of such expressions. The process of evaluating such expressions ultimately results in the construction of a finite state machine, such that the set of non-deterministic functions for describing the behavior of dynamic and relativistic systems is reduced to such a system. The behavior of the finite state machine can then be examined and analyzed. The present invention is useful for such applications as the examination of the temporal behavior of a DUT (device under test), as well as for examining the behavior of dynamic systems.

17 Claims, 12 Drawing Sheets

(a) Event $e$ sampled at $q$ (b) Proposition $p$ sampled at $q$ (a) Event $e$ sampled at $q$ (b) Proposition $p$ sampled at $q$ !q        p & q

Epsilon or

US 6,920,583 B1

SYSTEM AND METHOD FOR COMPILING TEMPORAL EXPRESSIONS

FIELD OF THE INVENTION

The present invention relates to a system and method for temporal language evaluation, and in particular, to such a system and method in which expressions constructed with the temporal language are evaluated for design verification.

BACKGROUND OF THE INVENTION

Design verification is the process of determining whether an integrated circuit, board, or system-level architecture, exactly implements the requirements defined by the specification of the architecture for that device. Design verification for a device under testing (DUT) may be performed on the actual device, or on a simulation model of the device. For the purposes of explanation only and without intending to be limiting in any way, the following discussion centers upon testing which is performed on simulation models of the device.

As designs for different types of devices and device architectures become more complex, the likelihood of design errors increases. However, design verification also becomes more difficult and time consuming, as the simulation models of the design of the device also become more complex to prepare and to test The problem of design verification is compounded by the lack of widely generalizable tools which are useful for the verification and testing of a wide variety of devices and device architectures. Typical background art verification methods have often been restricted to a particular device having a specific design, such that the steps of preparing and implementing such verification methods for the simulation model must be performed for each new device.

The process of verifying a design through a simulation model of the device is aided by the availability of hardware description languages such as Verilog and VHDL. These languages are designed to describe hardware at higher levels of abstraction than gates or transistors. The resultant simulated model of the device can receive input stimuli in the form of test vectors, which arc a string of binary digits applied to the input of a circuit. The simulated model then produces results, which are checked against the expected results for the particular design of the device. However, these languages are typically not designed for actual verification. Therefore, the verification engineer must write additional programming code in order to interface with the models described by these hardware description languages in order to perform design verification of the device.

Examples of testing environments include static and dynamic testing environments. A static testing environment drives pre-computed test vectors into the simulation model of the DUT and/or examines the results after operation of the simulation model. In addition, if the static testing environment is used to examine the results which are output from the simulation model, then errors in the test are not detected until after the test is finished. As a result, the internal state of the device at the point of error may not be determinable, requiring the simulation to be operated again in order to determine such internal states. This procedure consumes simulation cycles, and can require the expenditure of considerable time, especially during long tests.

A more useful and efficient type of testing is a dynamic testing environment. For this type of environment, a set of programming instructions is written to generate the test vectors in concurrence with the simulation of the model of the DUT and while potentially being controlled by the state feedback of the simulated device. This procedure enables directed random generation to be performed and to be sensitive to effects uncovered during the test itself on the state of the simulation model of the device. Thus, dynamic test generation clearly has many advantages for design verification.

Within the area of testing environments, both static and dynamic testing environments can be implemented only with fixed-vector or pre-generation input. However, a more powerful and more sophisticated implementation uses test generation to produce the environment.

One example of such a test generator is disclosed in U.S. Pat. No. 6,182,258, filed on Feb. 6, 1998, incorporated by reference as if fully set forth herein. This test generation procedure interacts with, and sits as a higher level over, such hardware description languages as Verilog and VHDL. The test generation procedure is written in a hardware-oriented verification specific object-oriented programming language. This language is used to write various tests, which are then used to automatically create a device verification test by a test generator module. A wide variety of design environments can be tested and verified with this language. Thus, the disclosed procedure is generalizable, yet is also simple to program and to debug by the engineer.

This language features a number of elements such as structs for more richly and efficiently describing the design of the device to be simulated by the model. Unfortunately, the disclosed language and resultant test generation environment does not include features for testing the state of the device over time. Such testing is performed by sampling the values for various variables at different times, either according to some triggering event or at predetermined times, and is termed "temporal coverage". Temporal coverage is a collection of coverage information based on the occurrence of some pattern in time, with the pattern itself being defined according to a temporal language. Temporal coverage differs from automatic coverage, which is triggered by the appearance of a line of code or other static event, in that temporal coverage is driven by the occurrence of events in time. Temporal coverage enables the behavior of the device to be monitored over time during the testing period, particularly since a circuit or other DUT cannot be exhaustively simulated, such that all relevant states are tested. Analysis of the coverage enables the designer to determine which states of the device require further testing. Such analysis can be facilitated with abstract state machines.

Various temporal languages are known in the background art, yet the construction and evaluation of expressions in such languages for the purpose of temporal coverage for design verification has so far proven to be highly limited. In particular, there is a requirement in design verification for describing and monitoring the behavior of concurrent systems such as digital hardware or communication protocols. Currently, such behavior is commonly characterized in the background art (as discussed in standard texts on the subject such as that of Emerson A., in *The Handbook of Theoretical Computer Science*, Elsevier, 1990) according to sequences of configurations of the system under consideration, or according to sequences of events occurring within the system. However, a more useful solution to this problem would enable both methods to be used when specifying behavior in temporal expressions.

The task of evaluating temporal expressions in a programming system is more complicated than that of evaluating logical or arithmetic expressions since a sequence of states, or snapshots of the program memory, must be considered, rather than a single state. Temporal expression evaluation commences at some point during program execution, and continues over a number of cycles of a clock defined by the program until the expression either succeeds or it fails. Success indicates that the preceding sequence of program states complies with, or satisfies, the mathematical definition of the temporal expression; failure indicates the converse.

Typically, the evaluation of a temporal expression is performed by using an abstract state machine, or automaton. These automata preserve only the minimum necessary information at each state, and in the transitions between states, rather than a complete snapshot of the program memory. Programming languages such as C or Verilog provide mechanisms for constructing automata that may represent temporal behavior by explicitly enumerating their states and the transitions between states. Other languages such as those based on the temporal logics CTL and LTL allow one to specify temporal behavior in a non-procedural declarative style by writing down a formula. Temporal e is a language of this latter kind (see for example SMV—"Symbolic Model Checking" Ken McMillan, Kluwer Academic Press 1993; Sugar—"Rule Base: an industry oriented formal verification tool" I. Beer et al. Proceedings DAC, ACM June 1996).

Since a temporal expression, or formula, represents the behavior implicitly it is necessary to devise a mechanism to recognize or implement that behavior. For temporal logics like CTL and LTL the common approach is to construct an automaton from the text of the formula via a procedure known as a tableau construction—so called because the tree like structure the procedure builds is known as a proof tableau in formal logic. For LTL and CTL the construction always gives rise to a finite automaton, but the details vary considerably because the procedures depend intimately on the mathematical semantics of the language concerned. For references to the background art see for example the work of Clarke et al. in *Proceedings of Computer-Aided Verification*, Springer-Verlag, 1994.

While LTL and CTL are targeted at formal verification, the e temporal language is primarily directed at simulation. While still applicable to formal verification, this language has proven to be easier and more intuitive to use, particularly for simulation, but still lacks a construction scheme.

SUMMARY OF THE INVENTION

The system and method of the present invention enables the behavior of temporal expressions to be analyzed for the evaluation of such expressions. The process of evaluating such expressions ultimately results in the construction of a state machine having a finite control structure. This state machine may optionally be deterministic, but alternatively may be non-deterministic. The behavior of the state machine can then be examined and analyzed. The present invention is useful for such applications as the examination of the temporal behavior of a DUT (device under test), as well as for examining the behavior of dynamic systems such as communication protocols in telephonic systems or internet applications, embedded software in command and control devices, and so on.

According to the present invention, a method for analyzing a temporal expression is provided, the method comprising: parsing the temporal expression to form a hierarchical tree, each node of the hierarchical tree containing a subexpression of the temporal expression; propagating a sampling event to each node of the hierarchical tree according to at least one Sampling rule; and determining each transition from each node of the hierarchical tree to a successor node according to at least one transition Step rule to analyze the temporal expression.

Hereinafter, the term "computing platform" refers to a particular computer hardware system or to a particular software operating system. Examples of such hardware systems include, but are not limited to, personal computers (PC), Macintosh™ computers, mainframes, minicomputers and workstations. Examples of such software operating systems include, but are not limited to, UNIX, VMS, Linux, MacOS™, DOS, FreeBSD, one of the Windows™ operating systems by Microsoft Inc. (USA), including Windows NT™, Windows95™ and Windows98™.

The method of the present invention could also be described as a plurality of instructions being performed by a data processor, such that the method of the present invention could be implemented as hardware, software, firmware or a combination thereof. For the present invention, a software application could be written in substantially any suitable programming language, which could easily be selected by one of ordinary skill in the art. The programming language chosen should be compatible with the computing platform according to which the software application is executed. Examples of suitable programming languages include, but are not limited to, C, C++ and Java.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1A:
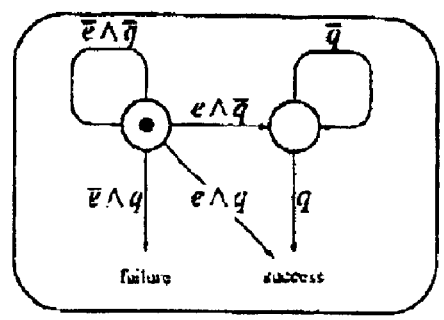
FIGS. 1A and 1B are schematic block diagrams illustrating a sampling event operator according to the present invention.

The system and method of the present invention enables the behavior of temporal expressions to be analyzed for the evaluation of such expressions. The process of evaluating such expressions ultimately results in the construction of a finite state machine, such that the behavior of the state machine can then be examined and analyzed.

According to preferred embodiments of the present invention, the process for converting the temporal expression to the state machine preferably includes the feature of creating an abstract tree representation of the expression. Such a tree is optionally created by a parser for the temporal language in which the expression is written.

Next, the tree is converted into a format in which a sampling event is attached to every subexpression, in order for the behavior of each subexpression to be evaluated. In order for the present invention to be operative according to the preferred embodiments described herein, the behavior of each portion of the overall expression must be evaluated, thereby requiring the presence of local sampling events within the tree.

According to preferred embodiments of the present invention, the syntax tree is then normalized to remove semantically anomalous subexpressions, which are also described in greater detail below. Such a normalization step is preferred in order to prevent the evaluation process from being halted and/or having an incorrect result from the effect of such anomalies.

The resultant tree is the initial state for the tableau construction procedure of the present invention, according to which a deterministic or non-deterministic state machine is created. This machine is created by determining the transitions from each node to successor nodes. Each newly created node represents a partial evaluation of the temporal expression, as the possible states which are inherent to the temporal expression are unfolded to form a set of states with successor relationships holding between them. This combination is actually the state machine, in which the possible set of behaviors of the system is delineated from the total universe of such behaviors.

As previously described, the present invention is useful for the evaluation of temporal expressions for design verification of a DUT (device under test). However, the present invention is not limited to such a use, and in fact is suitable for a variety of implementations in which temporal expressions for concurrent, dynamic systems must be evaluated and analyzed. Thus, the present invention is generally useful for applications in which the dynamic properties of a system must be analyzed and evaluated, specific examples of which include but are not limited to communication protocols such as implemented in telephonic systems and switching networks, or embedded control software in applications such as process control, robotics, and the like.

In order to more fully describe the present invention, precision is required concerning the mathematical meaning, or formal semantics, of the temporal language. The fundamental building blocks of temporal expressions according to the present invention are events that typically represent inputs to the system, and propositions that typically represent Boolean relationships over the components of the state, or memory, of the underlying system. Taken together these form the set of atoms. For any temporal expression the set of atoms mentioned in the formula is called the alphabet. A state is therefore a valuation for each atom in the alphabet, according to which the value is either currently true or false, if the atom is a proposition, or present/absent if the atom is an event.

Mathematically, a property is a set of sequences of states. Therefore, a temporal expression of the temporal language represents a set of sequences of states each member of which set is a sequence of finite-length. The index into such a sequence represents time, conveniently modeled by the non-negative integers, resulting in a linear-time semantics. In contrast, the previously described background art temporal language LTL has a linear-time semantics interpreted over infinite sequences, while the background art temporal language CTL has a branching-time semantics interpreted over infinite trees.

The universe of possible behaviors of a device under test as described by a temporal expression is thus represented by the (infinite) set of sequences of arbitrary, but finite, length. Every temporal expression represents a set of finite sequences of defined states. These sets are defined according to the syntactic form of the expression concerned. Before explaining the semantics of the operators of the language it is useful to mention two sets of sequences that are particularly important: Empty—the empty set of sequences; and Epsilon—the set containing only the empty sequence. When such sequences must be evaluated, "empty" set is taken to represent failure of expression evaluation, while the "epsilon" set is taken to represent success. In other words, a distinction must be made between the empty set of sequences or set which does not contain a sequence of states, which cannot be evaluated, and the set that contains the empty, or zero-length, sequence, such that the expression has been successfully evaluated.

Since a temporal expression specifies a set of sequences of states, a particular sequence can be stated to satisfy the temporal expression if and only if it is a member of the set defined by the expression. This set is defined compositionally from the operators and atoms appearing in the formula. The basic operators of the temporal language can then optionally be described as follows, at least for the implementation with temporal e.

First, the cycle operator is satisfied by any sequence of length one. This basic entity can be viewed dually as the proposition that it is true in every state, or as an event that is always present. In the latter case the syntax any is preferred.

Second, the atom operator is satisfied by any sequence of length one in which the atom is true for an atomic proposition, or present for an atomic event.

For a disjunction ("or") operator, a sequence satisfies T1 or T2 if and only if it satisfies either of the subexpressions. The or operator is interpreted as the union of the two sets of sequences. Conversely, for a conjunction ("and") operator, the sequence satisfies T1 and T2 if and only if it satisfies both subexpressions simultaneously. The and operator is interpreted as the intersection of the two sets of sequences.

For a "chop" operator, a sequence satisfies {T1; T2} if and only if it is composed of two sequences, the first of which satisfies T1, and the second of which satisfies T2.

For a firstmatch ("fm") operator, a sequence satisfies fm T1 if and only if it satisfies T1 but cannot be broken into two non-empty sequences of which the first satisfies T1.

For a fail operator, a sequence satisfies fail T1 if and only if it does not satisfy T1, and none of its prefixes satisfies T1, yet every prefix of the sequence is the prefix of some sequence that satisfies T1. Thus Firstmatch specifies the shortest sequences that satisfy the subexpression, while Fail specifies the shortest sequences that cannot satisfy the subexpression.

The basic operators defined above are used to enrich the syntax of the temporal language with several other constructs of general utility. Foremost amongst these are the repeat operators. For example, for the Fixed Repeat operator, the syntax [n]*T1 where n is a non-negative integer represents the n-fold repetition of the temporal expression T1. A sequence satisfies [n]*T1 if it is the concatenation of n subsequences, each of which satisfies T1. The only sequence that satisfies [0]*T1 for any T1 is the empty sequence.

For the True Match Repeat operator, the syntax ~[m..n] *T1 where both m and n are integers represents a variable number of repetitions of the sequences satisfying the temporal expression T1. The number of repetitions can vary between m (which if omitted is taken to be 0) and n (which if omitted is taken to mean an unbounded number of repetitions). The expression is ill formed if n is less than m.

For the First Match Repeat operator, the syntax {[m..n] *T1; T2} is an abbreviation for the Firstmatch fm {~[m..n] *T1; T2}. This specifies the shortest sequences that can be divided into a suffix satisfying T2 and a prefix satisfying the variable repeat ~[m..n]*T1. Typically, the repeat bounds are non-negative integer constants. However, in general they can be non-negative integer valued expressions that may vary over time. Unfortunately, allowing repeat bounds that are in effect variables increases the difficulty of expressing the behavior specified by such temporal expressions in a finite state machine.

Finally, the Fail and Chop operators are used to define the yield operator, for which the syntax T1=>T2 is used to express the concept that T2 must be satisfied only if T1 has been satisfied. The syntax abbreviates (fail T1) or {T1; T2}. The Yield operator is thus used to express causal relationships of the form if a sequence satisfies T1 then it must be followed by a sequence of states satisfying T2.

Figure 1B:
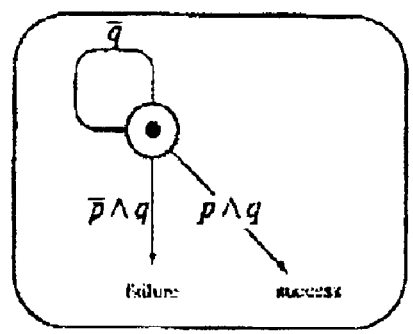

The final basic operator of the temporal language introduces the concept of a sampling event. A sampling event is a regular event which is used in the manner of a clock. This operator distinguishes atomic events from propositions, as shown in FIGS. 1A and 1B. FIGS. 1A and 1B are schematic block diagrams in which a sequence of different possible states is shown. These different states are created from different combinations of the presence or absence of the events e and q (FIG. 1A), or from different combinations of the presence or absence of the event q and the proposition p (FIG. 1A).

As shown in FIG. 1A, an expression which uses the Sampled Event operator, e @q, defines a sequence of states over which the sampling event (q) is not present, terminated by a state in which the event is present; in addition the event (e) must be present at least once in the sequence. This temporal expression therefore fails only if q strictly precedes e; it succeeds if e precedes or is coincident with q.

As shown in FIG. 1B, an expression which uses the Sampled Proposition operator, p @q, defines a sequence of states over which the sampling event (q) is not present, terminated by a state in which the sampling event is present and the proposition (p) is true. The underlying state of the system is examined when the event q occurs; if p is true the temporal expression succeeds, otherwise it fails.

In addition to sampling atoms, other types of expressions may also optionally be sampled through the Sampled Expression operator, as shown in the expression T @q, in which the expression T is sampled. When a sampling event is applied to an expression other than an atom, the effect is to transfer the sampling event to the atoms appearing in the subexpression. In the case of nested sampling events, the overall effect is to prolong a sequence that satisfies the subexpression up until the moment that the outer sampling event occurs. This operator thus specifies a default sampling event for all subexpressions that do not specify their own sampling event. In the absence of a sampling event being specified, the default is any. In the atomic cases if the specified sampling event is any, the descriptions above simplify to that of Atom cited earlier, a sequence of length one.

The previous discussion is intended to describe some basic operators and components for the present invention. The principles and operation of the system and method according to the present invention may be better understood with reference to the drawings and the accompanying description, which cover the procedure for converting a temporal expression into a state machine, for the purposes of analysis and evaluation.

There are several phases in the procedure for converting a temporal expression into a state machine, such that the temporal expression can then be evaluated. The starting point is the abstract syntax tree representation of the expression, which would typically be constructed by a parser for the temporal language (the construction of such parsers would be obvious for anyone of ordinary skill in the art).

In the first stage for the procedure for converting a temporal expression into a state machine, the syntax tree is transformed into a form where a sampling event is attached to every subexpression. This Sampling Propagation is a top-down process.

At the next stage the syntax tree is normalised to remove semantic anomalies such as a and fail a (and similarly any subexpressions equivalent to empty since these can never be satisfied), and [0]*T, and similar terms that are preferably represented by epsilon. This Epsilon Reduction is a bottom-up, term rewriting process.

The resulting expression is taken to be the initial node (initial state) for the Tableau Construction procedure. This phase of the procedure iterates through a number of steps that calculate, for each node that the procedure creates, the transitions from that node to its successors. Each node in the emerging graph is another temporal expression that represents a partial evaluation of the given expression.

Therefore, the present invention particularly relates to the procedure for Tableau Construction and in the definition of Sampling Propagation. With regard to the tableau construction procedure, according to preferred embodiments of the present invention, the procedure includes the steps of the pre-processing of Fail temporal expressions; the Step Rules used to compute transitions to successor nodes; and the Counter Rules and mechanisms dealing with variable repeat bounds. However the present invention also features the process of Epsilon Reduction, in which a number of equations between temporal expressions are used to simplify terms at each step of the Construction procedure. These equations, or reduce rules, derive directly from the formal semantics and thus constitute theorems of the language.

For ease of description, the first preferred procedure of the present invention which is described is the Sampling Propagation procedure. In this procedure, the Sampling(T, q) function receives two inputs and yields one output. The first input (T) is the abstract syntax tree (AST) representation of a temporal expression as supplied by the language parser. The second input (q) is a default sampling event supplied by the context, usually the special event any. The procedure returns a modified syntax tree with the property that every subexpression is explicitly sampled by the innermost sampling event in whose scope the expression lies. This semantically equivalent expression is in sampled normal form, such that if the procedure is run a second time on the returned AST, with the same default sampling event, then the result is syntactically unchanged.

The purpose of this transformation is to render the global effect of the default sampling event into a local effect; subsequently the tableau construction need not be concerned with the presence of a default sampling event at all, thus simplifying that procedure considerably.

The easiest way to understand the Sampling function is to suppose that each abstract syntax tree node is a record structure that at a minimum contains fields indicating (a) the type of expression it represents like Conjunction, Fixed Repeat, and so on; (b) pointers to its subexpressions; and (c) a sample field which is initially undefined that indicates the sampling event of the expression. The Sampling function is then applied recursively starting with the root node of the AST and working towards the atoms that are at the leaves of the tree. The effect of applying the function Sampling(T, q) then depends on the nature of T and q. In general the effect is to set the sample field in the AST node T equal to q, and then propagate the sampling event to the subexpressions, if any. Sometimes a new instance of a Sampled Expression AST node needs to be created before applying the function recursively.

For example, if T is an instance of the Chop operator, a new Sampled Expression node is created with q as its parameter and T as its subexpression (T @q). If T is an instance of a Sampled Expression with the parameter @r, for example, a new Sampled Expression node is created with parameter @q and subexpression T (T @r @q). The sampling event r is now propagated throughout the subexpression instead of q. The subexpression may optionally itself be a temporal expression.

Figure 2A:
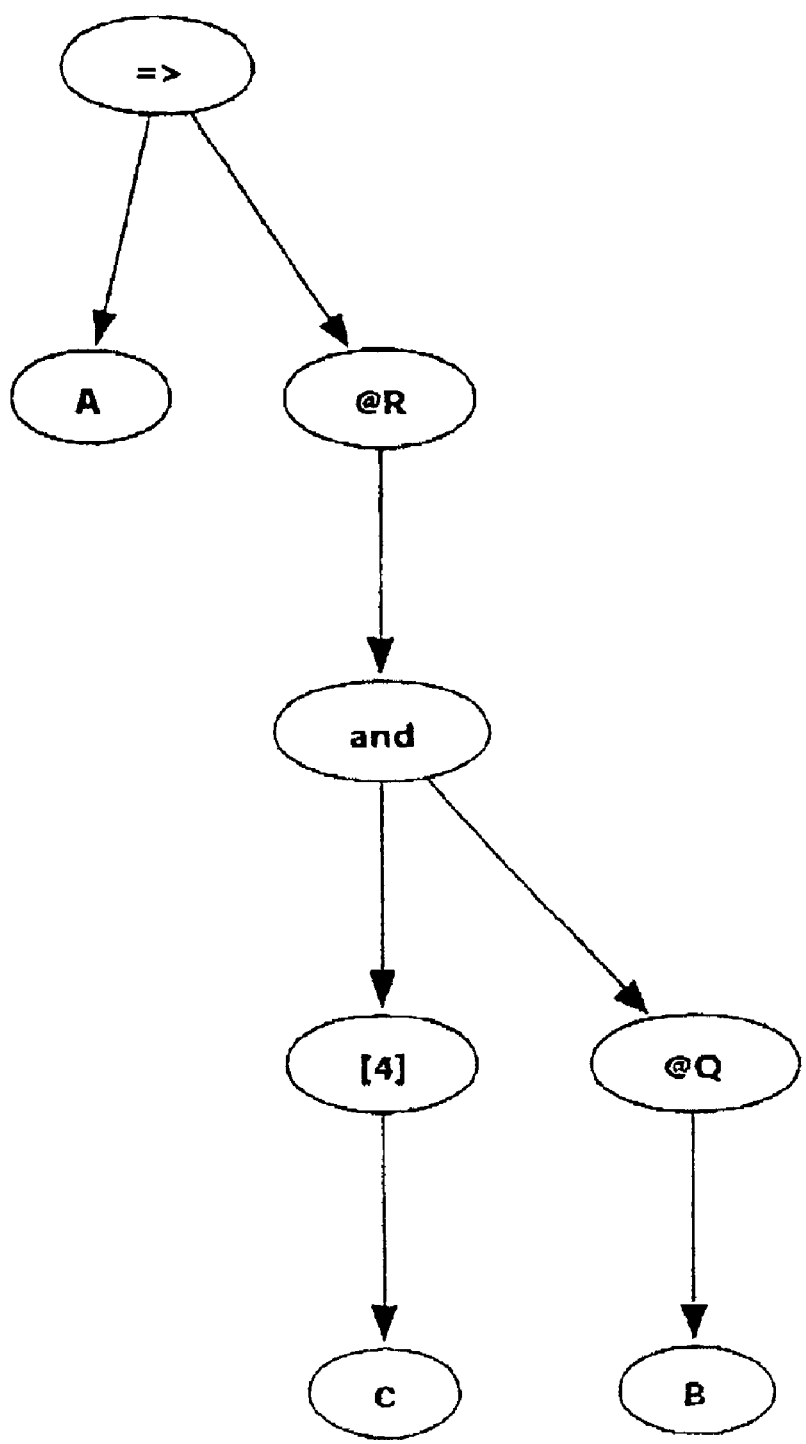
FIGS. 2A and 2B are schematic block diagrams of an exemplary tree before (2A) and after (2B) sampling events have been attached according to the present invention.
Figure 2B:
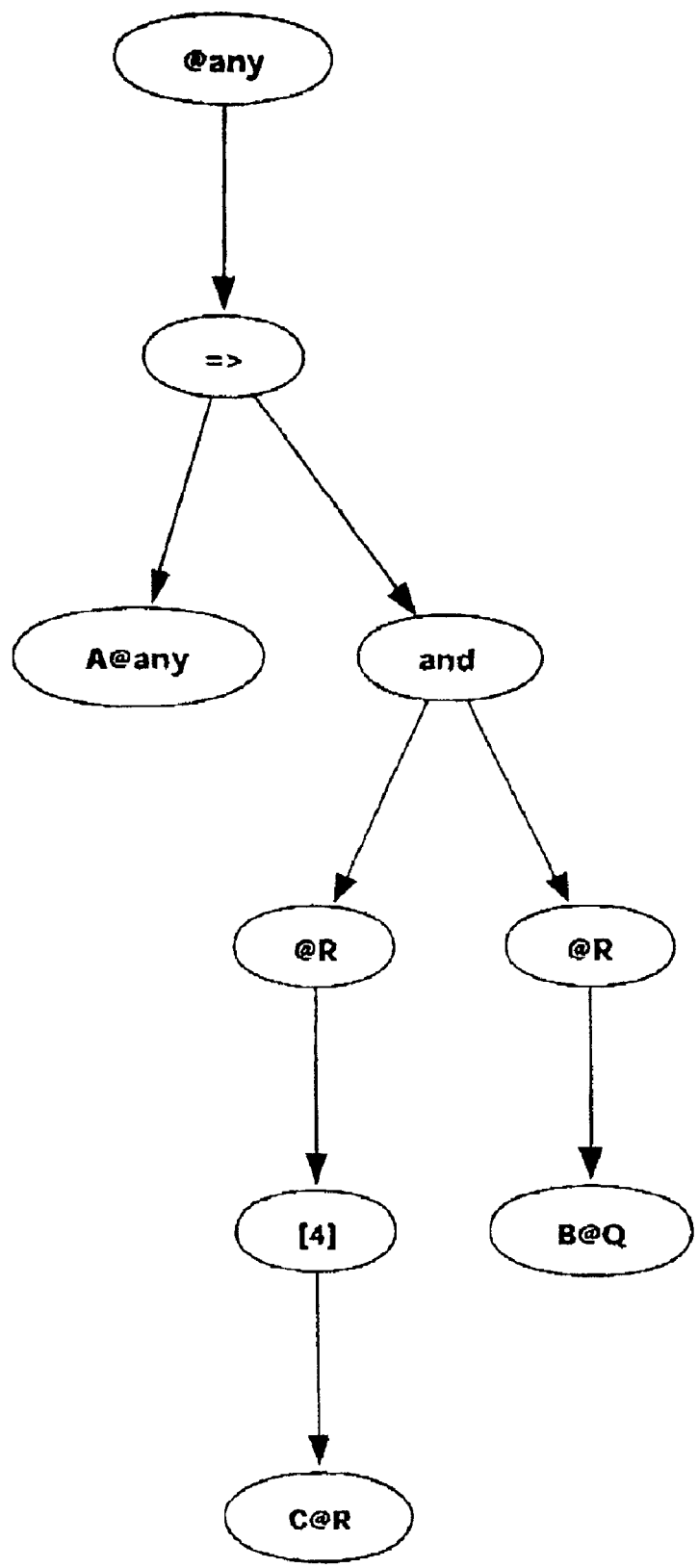

Those operators of the temporal language that are derived from Chop also cause a new Sampled Expression AST node to be created to contain them. These are Fixed, True and First Match Repeat, Fail, and Yield. As an example, FIG. 2 shows such a tree before (FIG. 2A) and after (FIG. 2B) the evaluation of the function Sampling (A =>(B @Q and [4]*C) @R, any). As can be seen, the tree in FIG. 2B now features additional nodes, created during the evaluation of the above function. The Sampling function defined as stated above is idempotent given the simple optimisations as shown below:

T @q @q=T @q

T @q @any=T @q

The requirement that the function be idempotent can in fact be relaxed if Sampling Propagation is only applied once to a temporal expression, and not repeatedly. Under these circumstances the new Sampled Expression nodes need not be created.

Turning now to the next stage of the process for creating the state machines in order to evaluate the temporal expression, optionally and preferably the process of Epsilon Reduction is performed. This phase of the process is based upon a term rewriting system. The rewriting rules (reduce rules) that the Reduce function manipulates are equations that are applied in the left-to-right direction to transform a term (i.e., a temporal expression) into a syntactically different but semantically equivalent term. This process is preferred, since the steps of transformation help to ensure that the Tableau Construction procedure always terminates.

The reduce rules are derived from the semantics of the operators of the language, in this case from the e language, and are used to manipulate the semantic entities Epsilon and Empty which are taken to represent success and failure of temporal expression evaluation. It is therefore convenient to introduce syntactic correlates of these semantic entities—viz. epsilon and empty—even though these are not regular components of the language's syntax.

An expression is reduced when it is in a normal form that is essentially a Disjunction of terms, none of which is an instance of a Repeat temporal expression, and where at most one of the disjuncts is equivalent to Epsilon. This is a semantic criterion. However, if the reduce rules are applied in a bottom-up fashion so that the Reduce function is only applied to expressions whose subexpressions are already reduced, then the syntactic version of this rule, in which at most one of the disjuncts equals epsilon, is sufficient. This invariant can be guaranteed under the proviso that Fail subexpressions receive separate consideration.

Epsilon Reduction happens once in a depth-first recursive application of the reduce rules before the Tableau Construction begins. Thereafter, as part of every step of the construction procedure, the Reduce function is applied nonrecursively to ensure terms that represent states in the state machine are always reduced terms.

The rules for reduction can optionally be divided into ordinary rules and special rules which are required for repeat operators. Instances of simple rewriting rules of general utility are as follows:

T or T=T

In other words if T1 and T2 are syntactically equal then T1 or T2 simplifies to T1. The intuition behind the next two examples fm fm T=fm T fm (T1 or fm T2)=fm (T1 or T2)

is that nested applications of Firstmatch are redundant. These rules are mentioned since they are important for the termination of the Construction procedure. Similarly, the rules {epsilon; T}=T fm (epsilon or T)=epsilon $[n]^*$(epsilon or T)=$^{18}$ $[..n]^*$T illustrate how epsilon, which represents an empty sequence and is then interpreted as success, is manipulated.

Special rules are preferred for repeat operators. The technique for dealing with the repeat operators when reducing a temporal expression is to unfold the repeat once. For example, this approach works for Fixed Repeat and a version of First Match Repeat as follows:

$[0]^*$=epsilon $[n]^*$T={T; $[n-1]^*$T}

{$[..0]^*$T1; T2}=fm T2

{$[..n]^*$T1; T2}=fm (T2 or {T1; $[..n-1]^*$T1; T2})

The other repeat operators are dealt with analogously.

Next, once these processes have been performed in order to render the expressions in a format which is suitable for construction of the tableau, the actual construction of the tableau itself, or finite state machine, may begin. The Tableau Construction procedure takes as input the AST representation of a reduced temporal expression and produces as its output a directed graph structure, or finite state machine, that represents the behavior of the expression. The root node in the graph represents the input temporal expression; other nodes in the graph represent intermediate stages in the evaluation of the temporal expression over time as determined by the fastest clock any. Thus the edges in the graph are labeled by the conditions under which the evaluation of the expression evolves in one time step. The conditions are Boolean combinations of the atoms mentioned in the expression and are calculated by the Step rules described below.

If the input temporal expression is unsatisfiable the construction process returns the empty graph. Optionally, the process returns a single node with no edges; this singular graph represents success, and the Tableau Construction demonstrates in this case that the input temporal expression is equivalent to epsilon.

Normally the procedure returns a graph structure with one or more nodes that represent either epsilon, or epsilon or T for some T. Any traversal of the graph from the root node to such an epsilon node represents a successful evaluation of the temporal expression (the edges traversed determine a satisfying sequence). Conversely, given a putative satisfying sequence if every traversal of the machine from the root node arrives at a non-epsilon node when the current state in the sequence does not agree with any of the conditions of the outgoing edges, then the sequence does not satisfy the temporal expression, such that the process of evaluation is halted.

The central component of the Construction procedure is the Step rules that calculate for each node the set of transitions from that node. A transition is a pair (transition label, successor node)

in which the successor node is reduced on-the-fly by an application of Epsilon Reduction. The Step rules are applied successively to each new node encountered during the Construction. The process terminates because the Reduce rules (e.g., those listed above regarding or and fm) serve to keep each intermediate temporal expression constructed in a normal form that eliminates duplicate terms when they arise.

The second key component of the Construction procedure is a mechanism for pre-processing Fail subexpressions. This amounts to pre-computation of the graph representing any fail T subexpressions, and caching the results for reuse later in the main run of the Construction procedure. This pre-computation is necessary to ensure the resultant graphs correctly represent only the sequences satisfying the given temporal expression. This represents a property of tableau constructions known as soundness in the background art, as described for example with regard to the temporal logics CTL and LTL (see for example "Another look at LTL model checking" E. M.Clarke et al., Formal Methods in System Design Vol 10(1), Kluwer Academic Press).

Finally, a mechanism is defined for dealing with repeat bounds via counters. This is a means of dealing with Fixed, True, and First Match Repeat constructs more efficiently than the serial unfolding by which the operators are defined in the formal semantics. This mechanism also implements a means of handling repeat bounds that are non-constant integer expressions. The previously described formal semantics for evaluation only describes a single evaluation of an expression and thus assumes that repeat bounds are constants.

Figure 3A:
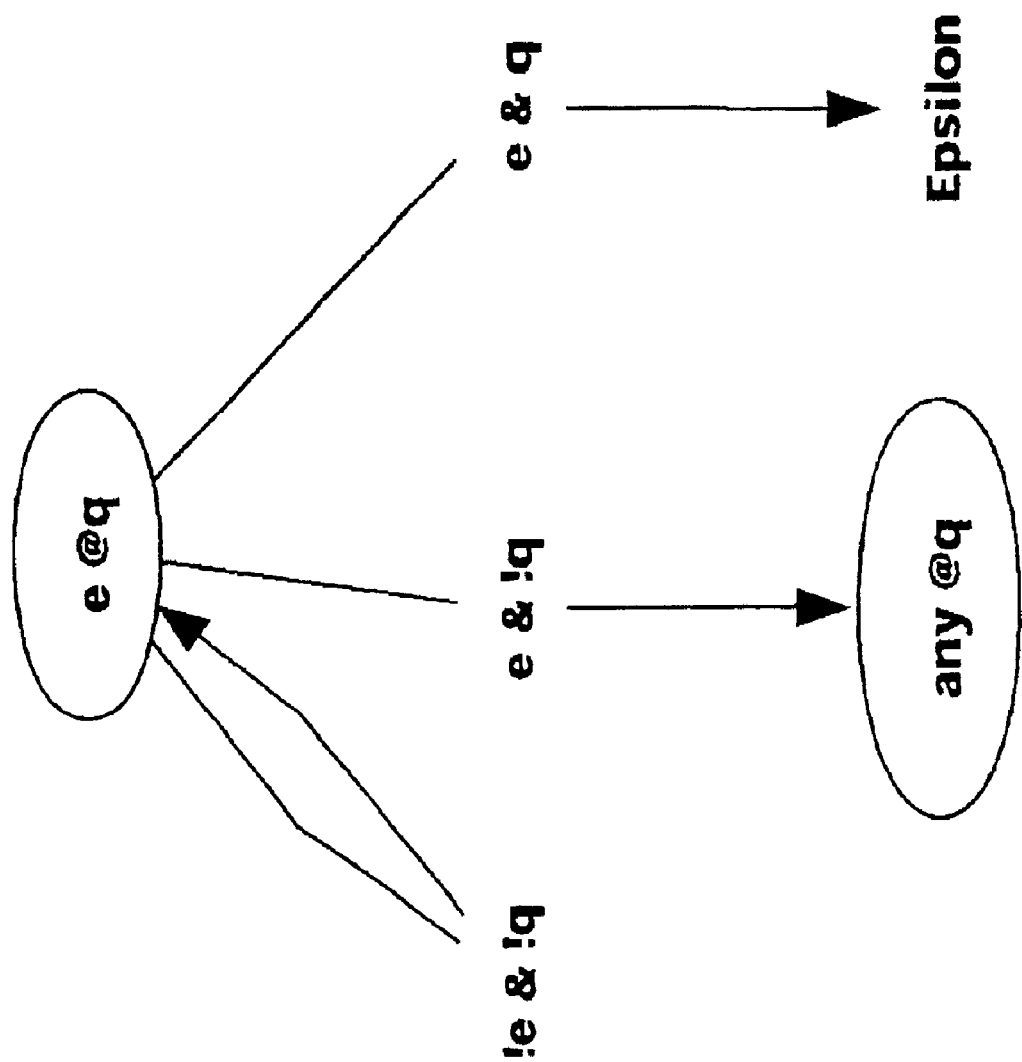
FIGS. 3A–3C are exemplary transition sets for atomic events and propositions according to the present invention.

The Step rules and these other mechanisms are described in greater detail below. First, the Step rules are defined compositionally according to the syntax of the temporal language. For the Atoms, the relevant transitions are best explained by the diagrams in FIGS. 3A–3C. Recall that in a reduced term every Atom has a sampling event, such as q, for example. There are three transitions from the expression e @q, as shown in FIG. 3A. One transition is labeled with the Boolean condition e & q and leads to epsilon; one transition is labeled !e & !q and loops back to itself; the third transition is labeled e & !q and leads to a new state in the machine, specifically any @q. The "missing" transition !e & q leads to empty. All transitions to empty are omitted in the Tableau Construction procedure.

Figure 3B:
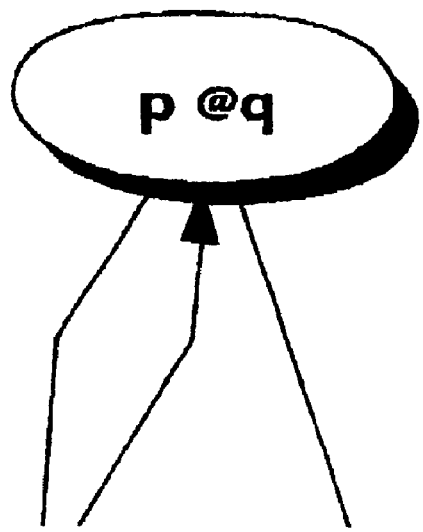
Figure 3B:
Figure 3C:
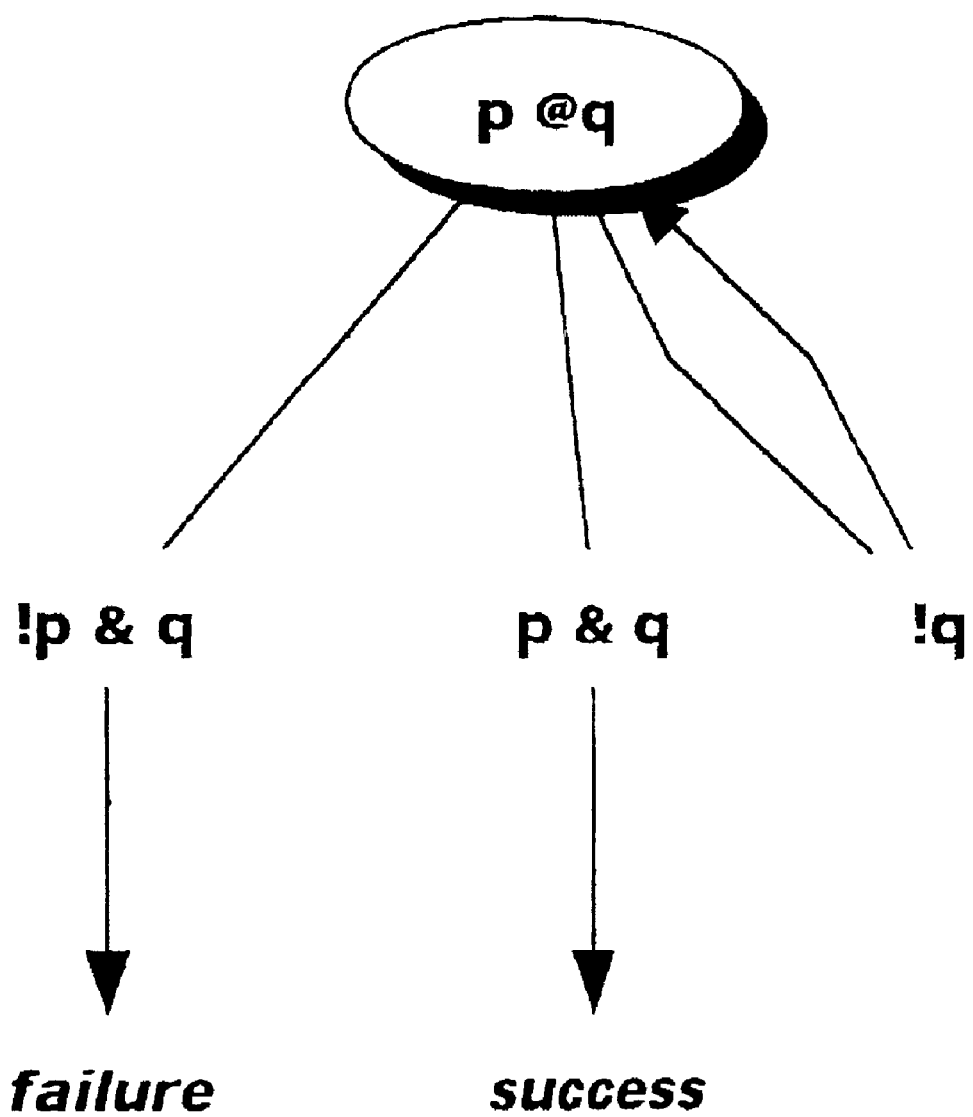

Note that if the sampling event (q) is any, as shown in FIG. 3B, the three Atom rules displayed all degenerate into a single transition labeled e, p or true as the case may be. In particular, the transition labeled !q loops back to itself, and the transition labeled q leads to epsilon. For the proposition of FIG. 3C (p @q), there are again two transitions: the transition labeled !q loops back to itself, and the transition labeled p & q leads to epsilon.

Step rules that are required for the operators of the language concern Disjunction, Conjunction, Chop, Sample, and Firstmatch. These rules build a set of transitions from each of the expression's immediate subexpressions, and combines these sets in a manner determined by the operator. Without loss of generality Disjunction, Conjunction and Chop are taken to be a binary operators for the purposes of discussion only, and without any intention of being limiting.

Figure 4:
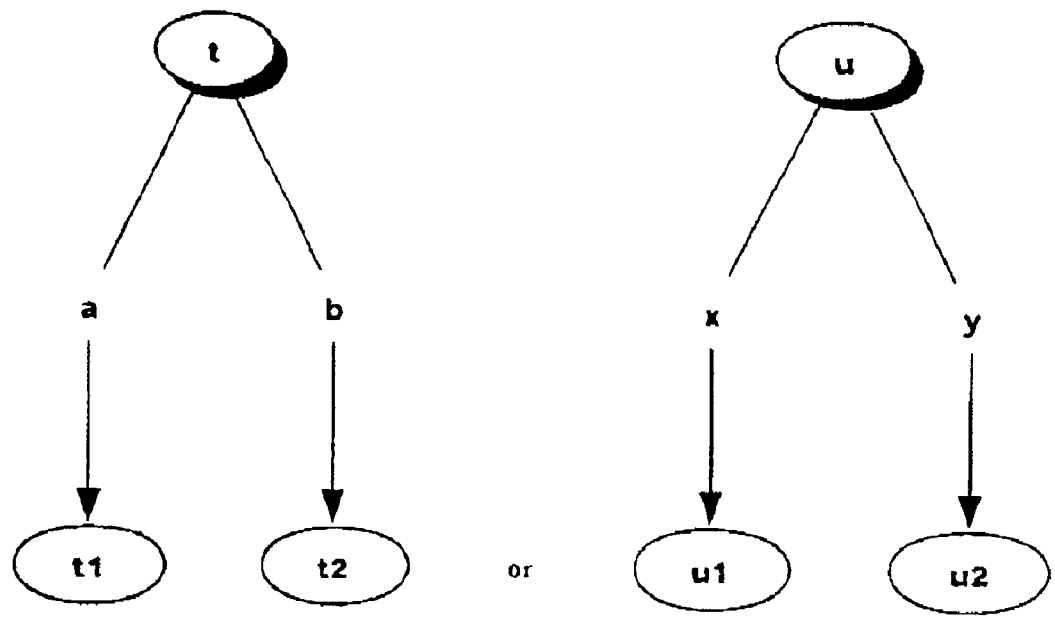
FIG. 4 is an illustration of the step rule for the disjunction operator according to the present invention.
Figure 4:
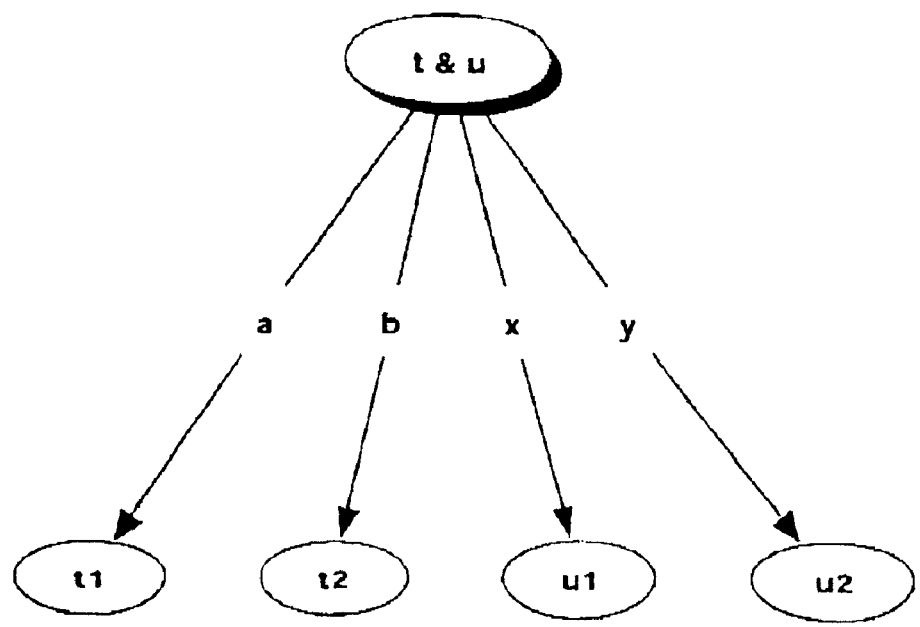
Figure 5:
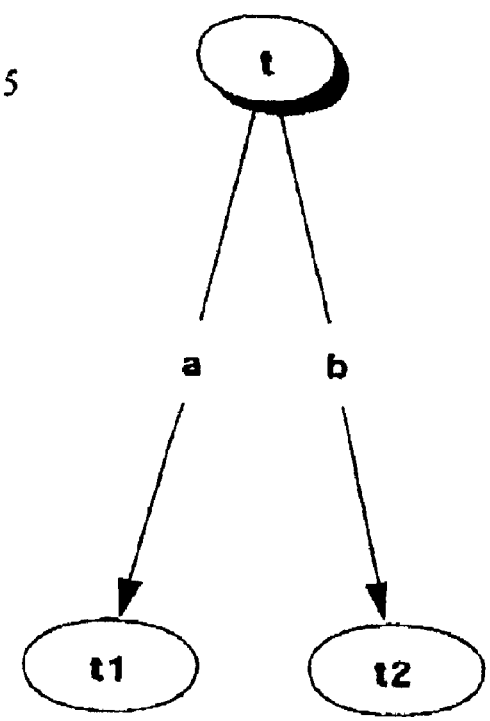
FIG. 5 is an illustration of the step rule for determinizing transitions according to the present invention.
Figure 5:
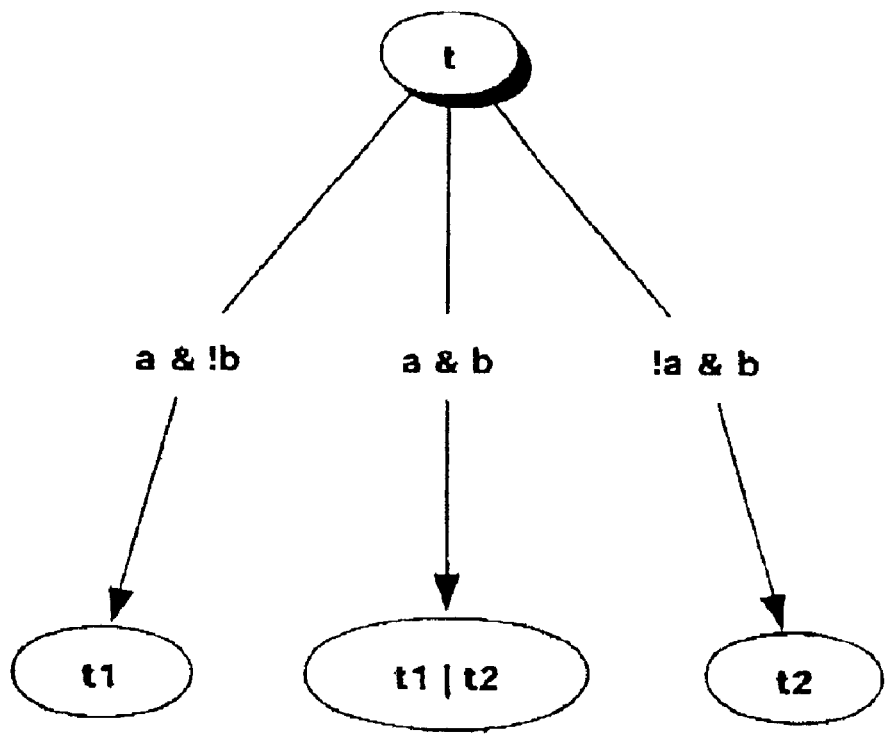

With regard to the disjunction operator, in its simplest form this rule just returns the union of the two sets of transitions derived from the subexpressions, as shown in FIG. 4. The disjunction function itself is shown with the two top trees, which are then combined to form the single tree at the bottom. However, in certain situations a deterministic graph must be built, in which case the Step rule for Disjunction must turn this set into a larger set of deterministic transitions, such that the transition labels are mutually exclusive. Well known procedures exist for achieving this deterministic state, as illustrated in FIG. 5, in which the graph is expanded to form a deterministic graph with all possibilities explicitly given.

Figure 6:
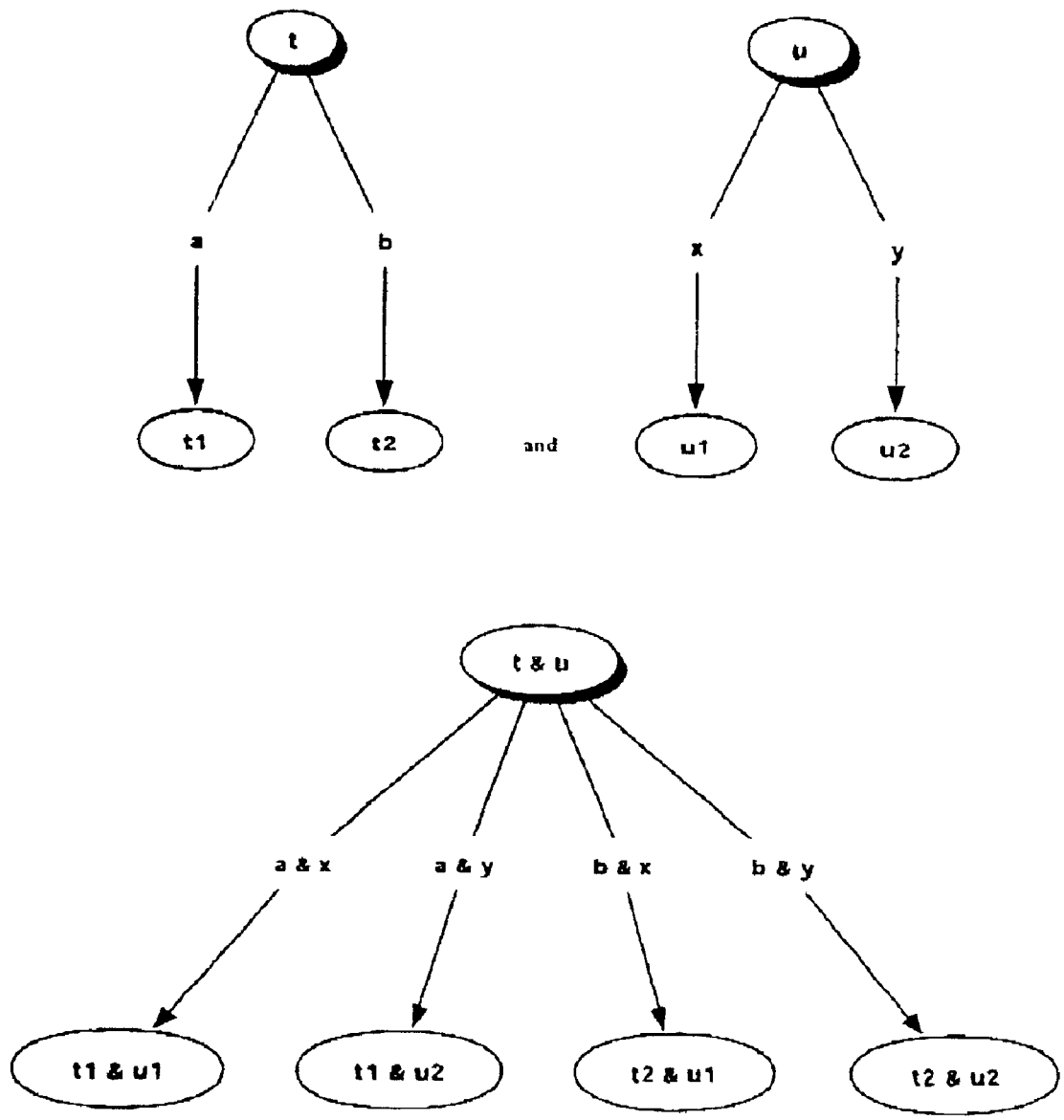
FIG. 6 is an illustration of the step rule for the conjunction operator according to the present invention.

The step rule for the conjunction operator must form a product set of transitions from two given sets of transitions, in which each transition in the first set is paired with every transition in the second set. This process is schematically depicted in FIG. 6, in which the two top graphs are shown with the conjunction operator, and the bottom graph illustrates the combination after the rule has been applied. This rule preserves determinism, such that if the two sets of transitions derived from the subexpressions are deterministic, then the result of the combination is also deterministic.

Figure 7:
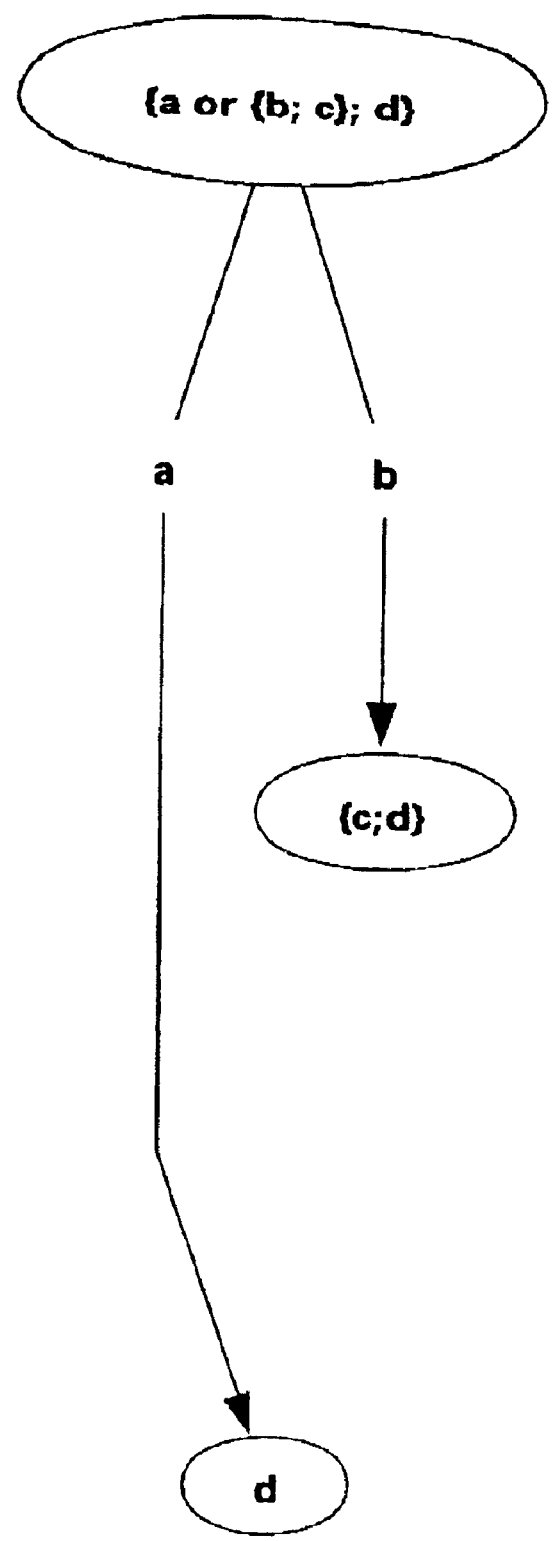
FIG. 7 is an illustration of the step rule for the chop operator according to the present invention.

The step rule is applied only to the leftmost expression in the Chop AST node, such as T1. The rightmost expression (T2) is retained. Each transition (a, T) derived from T1 is then transformed by "chopping" it with T2 to get (a, {T; T2}). The application of this rule is illustrated schematically in FIG. 7. This rule also preserves determinism.

For the rule pertaining to the Sampled Expression operator, in principle all the transitions (a, T) obtained from the subexpression are transformed into (a, T @q). The exception to this rule occurs when the successor node is an epsilon node, in which case the transition is split into two. Thus (a, epsilon) becomes (a & q, epsilon) (a & !q, cycle @q)

and (a, epsilon or T) becomes (a & q, epsilon or T @q) (a & !q, cycle @q or T @q)

Again, this Step rule preserves determinism.

The Step rule for firstmatch transforms each transition (a, T) obtained from the subexpression into (a, fm T). Preferably the set of transitions obtained from the subexpression is determinized to ensure that the reduce rule fm (epsilon or T)=epsilon correctly implements the semantics of Firstmatch.

In each of the Step rules described above, there is a stage where a new temporal expression is formed from the old expression and the successor node returned in the transitions from the subexpression. This is the point where the Reduce rules are applied to ensure that the Step rules always return a reduced set of transitions.

There are no Step rules for the repeat operators because they are always reduced to terms through the use of the Chop and Disjunction operators. The Yield operator is best dealt with via its definition in terms of the Fail and Chop operators.

The step rule for the Fail operator assumes that the graph of fail T has already been constructed and that the immediate transitions of the term are available in some lookup table. The transitions of fail T are of the form (a, epsilon), or (a, fail T1) for some T1 that differs from epsilon. The set of transitions of fail T is always deterministic.

Another optional but preferred component of the system for evaluation temporal expressions is the exec function, which is not a temporal operator so much as a mechanism for associating an action, say running a program subroutine or emitting an event, with the successful evaluation of a subexpression of a temporal expression. For example, the function {T1 exec {prog( )}; T2} associates the action prog( ) with any success of T1, which becomes a side effect of one or more transitions in the state machine. The Tableau Construction can easily deal with these side effects by generalizing the concept of a transition label to a pair;

(Boolean expression, list of actions)

The Step rule for Exec simply adds prog( ) to the action list of any transition of the subexpression that has epsilon or epsilon or T as the successor.

The presence of the action list results in the preferred addition of minor modifications in the Step rule for the Conjunction operator, since the actions must be copied to every transition in which the associated Boolean expression appears positively, but not those where it is negated. A similar amendment is needed in the determinizing version of Disjunction which also merges transitions together.

In all respects, other than the treatment of Fail subexpressions, the process for Tableau Construction is syntax directed, such that the Step rules do not need to look ahead or complete the tableaux of the subexpressions before continuing. The difference regarding Fail expressions resides in the observation (from the semantics of the operator) that fail T for any expression T that cannot fail is equivalent to Empty; however, to discover that T cannot fail, the entire tableau may need to be built. This problem is compounded by laws of the form fail empty =epsilon, and conversely.

Nevertheless, the Fail may be considered syntactically by first constructing the fail subexpressions and transforming their graphs appropriately. This procedure is best applied during the recursive depth-first application of Epsilon Reduction since it amounts to a reduce rule for fail T. Without loss of generality suppose that T contains no Fail subexpressions. The following process is then preferably followed, as described with regard to FIGS. 8A–8D.

In the first step, the deterministic graph of T is computed. It is helpful, though not essential, if the graph of T is stored as a tree rather than as a directed, possibly cyclic, graph.

Figure 8A:
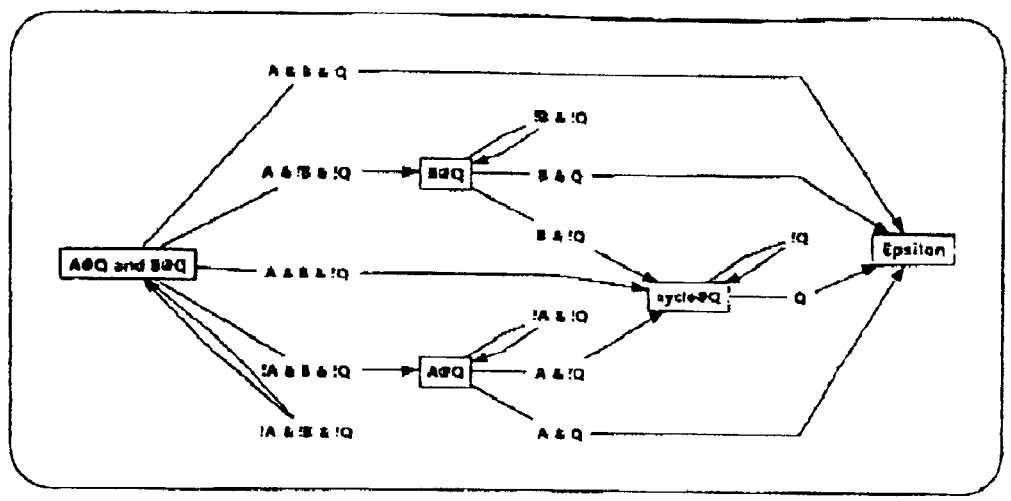
FIGS. 8A–8D are illustrations of an exemplary method according to the present invention for syntactically evaluating the fail operator.
Figure 8B:
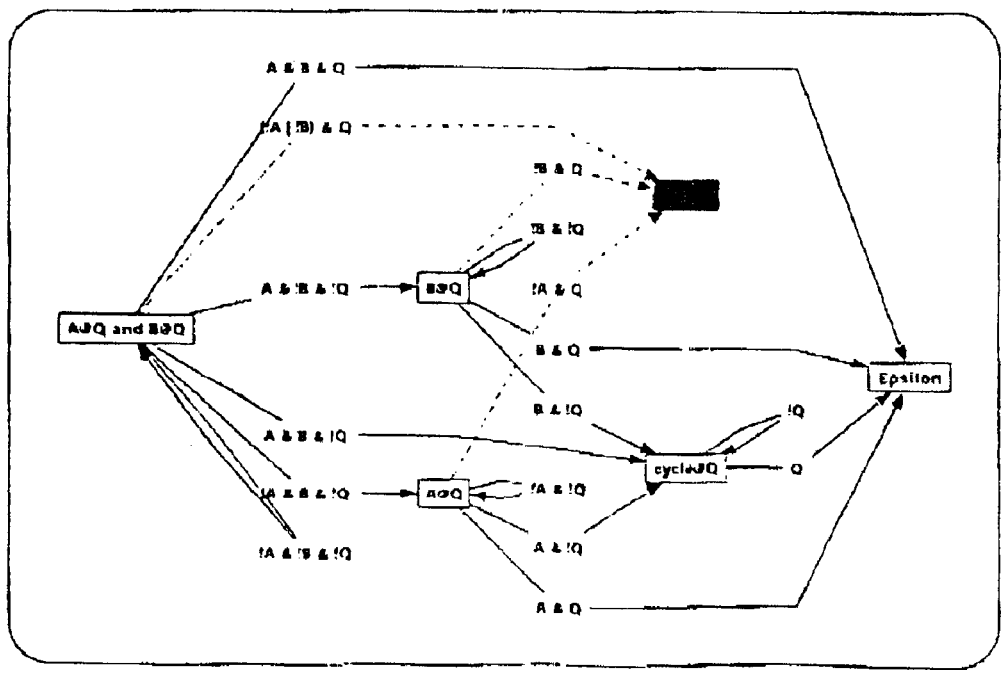

From this deterministic graph, delete all edges to empty; if this step leaves any non-epsilon nodes that have no successors, recursively remove these as well. This step can optionally be performed with a single depth-first traversal of the tree, as shown with regard to FIG. 8A. FIG. 8A is a schematic block diagram of the graph of the expression A@Q and B@Q with regard to the Fail operator, after the performance of this step.

For each node in the graph, now add a default transition to empty. If a node's outgoing edges are labeled with Boolean expressions a and b for example, the default transition is labeled !a & !b. The graph after such a step has been performed in shown in FIG. 8B.

Figure 8C:
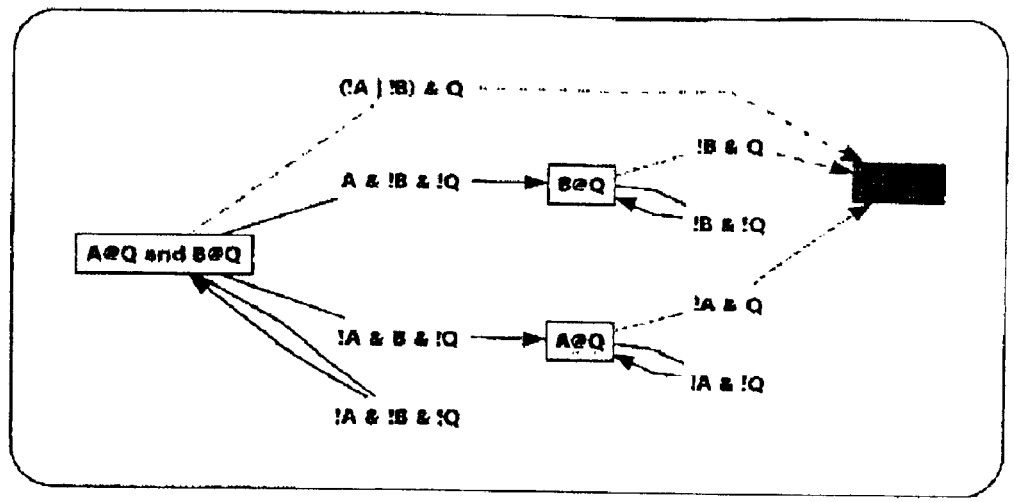

A depth-first traversal is then performed for this graph, removing any epsilon, or epsilon or T node unconditionally, and removing any node that is not on a path to empty, as shown in FIG. 8C.

Figure 8D:
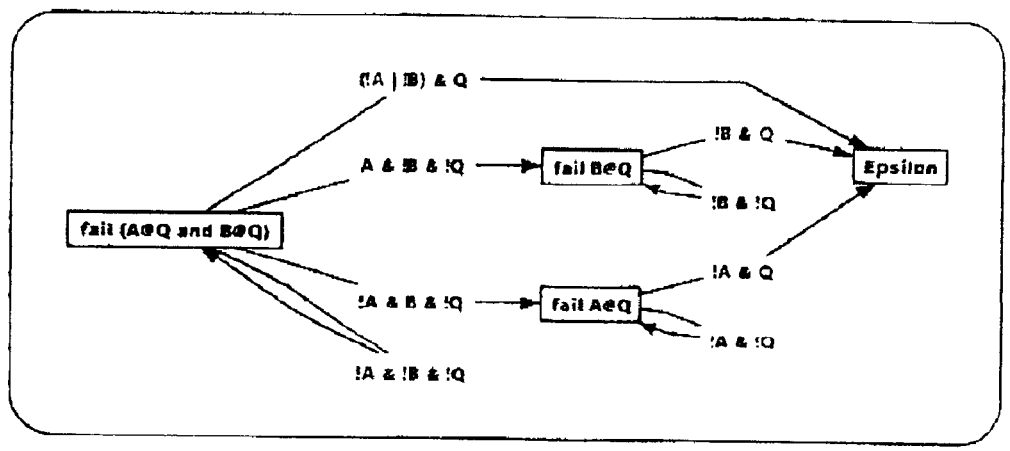

Finally, the resultant graph is transformed by converting empty to epsilon, and renaming all other nodes T1 to fail T1. This step ensures that the computation can be reused. The resultant graph is shown in FIG. 8D.

If the graph is now empty, then the result should be to return the singular graph epsilon (since fail empty=epsilon). In this case fail T is replaced by epsilon in the temporal expression including this subexpression.

The Reduce rules for the repeat operators tacitly assume that the numeric bounds are specified by non-negative integer constants. The Construction procedure described thus unfolds these loops creating a large graph structure. It is possible, instead, to fold the complexity of such graphs into numeric counters which are used to represent the loop unfolding in a smaller graph structure. This entails interpreting a non-finite state machine through some runtime machinery that handles initialisation, decrement, and discard of counters. This same mechanism also handles non-deterministic transitions and repeat bounds that are specified as integer variables (expressions) rather than numeric constants. The counters controlling such loops may in general be reinitialised at times during expression evaluation with various non-negative integer values.

In order to algebraically manipulate these generalised repeat terms through the Reduce rewriting system, a preferred component is an additional AST node type that represents a Conditional (temporal) expression.

if (p, T1, T2)

The test (p) is a Boolean expression; T1 is the true branch and T2 the false branch of the conditional. For a given integer counter expression N used as a repeat bound, such as in the temporal expression [N]*T, there is an associated integer counter variable n, together with two propositional variables here referred to as A(n) and L(n). Conditional expressions used in manipulating repeat terms come in two versions.

In the first version, for if (A(n), T1, T2), if A(n) is true now this expression behaves like T1, otherwise it behaves like T2. A(n) actually represents a predicate that checks the counter expression N>0. In case N>0 is true, a side effect is associated with the transitions created to T1 which causes the counter variable n to be initialised to N−1.

For the second version, for if (L(n), T1, T2), if L(n) is true now this expression behaves like T1, otherwise it behaves like T2. L(n) represents a predicate that checks the counter variable n>0. In case n>0 is true, a side effect is associated with the transitions created to T1 which causes the counter variable n to be decremented.

With these constructs the Fixed Repeat AST node [N]*T is initially reduced thus:

[N]*T=if (A(n), {T; [n]*T}, epsilon)

This formulation assumes that the data structure representing the Repeat AST node is instrumented so as to distinguish the cases [N] and [n]. As the Tableau Construction proceeds, the Fixed Repeat reduces because of:

[n]*T=if (L(n), {T; [n]*T}, epsilon)

In general there are two such rules for each of the repeat operators.

The term rewriting implemented in the Reduce function needs to be extended to handle Conditional expressions. The appropriate rules address the way this new expression type interacts with the other operators. For instance with regard to the Conjunction ("and") and Fail operators:

T and if (p, T1, T2)=if (p, T and T1, T and T2)

fail if (p, T1, T2)=if (p, fail T1, fail T2)

The rules for Disjunction, Firstmatch, Sample (and Exec) are similar. The Conditional operator thus distributes over the other previously described operators of the temporal language. The net effect of applying these Reduce rules is that if AST nodes migrate towards the root of the expression's syntax tree.

No Step rule is required for Conditional expressions. Instead, whenever a transition to a conditional is created, the transition is split. Thus if the transition label is the pair (a, L) and this successor node is if (p, T1, T2), the transition is split into two:

((a & p, L1), T1) ((a & !p, L), T2)

so that the if operator disappears. The test, either L(n) or A(n), is added to the Boolean condition and in the case that the test is true the side effect (initialising the counter variable, or decrementing it) is added to the action list. That is L1 is L with the additional action associated with the counter.

Since the manipulation of Conditional temporal expressions is novel it is necessary to explain more precisely how the various repeat operators are reduced during the Tableau Construction. There are some pitfalls to be avoided when generalising the approach sketched above for Fixed Repeat. In general there are two rules for each repeat operator, one expressed in A(n) for initialization of the loop, and one in L(n) for decrementing the loop. For the following discussion, only the A(n) rules are stated unless the L(n) are substantially different.

The rule cited above for Fixed Repeat, viz.

$$[N]*T = \text{if } (A(n), \{T; [n]*T\}, \text{epsilon}) \quad \text{Equation (1)}$$

illustrates the general principles involved. There are however two special cases to consider. Firstly if the repeated expression (T) is an epsilon term (epsilon or T1, say):

$$[N]*T = \text{if } (A(n), \text{epsilon or } \{(T1; [n]*T\}, \text{epsilon}) \quad \text{Equation (2)}$$

Secondly, if the repeated term T is also a Conditional if (A(p), epsilon or T1, T2):

$$[N]*T = \text{if } (A(n), \text{if } (A(p), \text{epsilon or } \{T1; [n]*T\}, \{T2; [n]*T\}), \text{epsilon}) \quad \text{Equation (3)}$$

Nested repeat operators give rise to nested Conditional expressions like this. Such nested conditional statements are generally to be avoided during the construction by splitting the transition in the manner described for the Sampled Expression above at the earliest opportunity. There is a symmetric rule in case the epsilon term is in the false branch of the nested Conditional.

These special cases for Fixed Repeat are needed since applying equation (1) instead of equations (2) or (3) in these circumstances causes the rewriting system to enter into an infinite loop trying to reduce the true branch of the Conditional. These special cases are justified by mathematical analysis of the behaviour of Fixed Repeat under such divergent circumstances: the resulting rules are valid for any reduced expression T.

The rules for True Match Repeat are best understood by considering this as four different repeat operators, viz: ~[..], ~[..N], ~[M..], and ~[M..N]. For the case ~[..] there are no counters since this specifies an infinite repetition. Thus $$\sim[..]*T = \text{epsilon or } \{T; \sim[..]*T\} \quad \text{Equation (4)}$$

In this case, and in the case of $$\sim[..N]*T = \text{if } (A(n), \text{epsilon or } \{T; \sim[..n]*T\}, \text{epsilon}) \quad \text{Equation (5)}$$

the repeated term (T) can always be reduced to a non-epsilon term, or to a Conditional whose branches are non-epsilon terms. This follows from the properties of True Match Repeat.

In the other two cases however the repeat initially behaves like Fixed Repeat (until the first counter reaches zero), and thereafter behaves like True Match Repeat. The same consideration with respect to repeated expressions that may be epsilon terms therefore also apply here. In general $$\sim[M..]*T = \text{if } (A(m), \{T; \sim[m..]*T\}, \sim[..]*T) \quad \text{Equation (6)}$$

However if the repeated expression T is, say, epsilon or T1, then $$\sim[M..]*T = \text{if}(A(m), \text{epsilon or } \{T1; \sim[m..]*T\}, \sim[..]*T1) \quad \text{Equation (7)}$$

and if T is, say, if (A(p), epsilon or T1, T2) then $$\sim[M..]*T = \text{if } (A(m), \text{if } (A(p), \text{epsilon or } \{T1; \sim[m..]*T\}, \{T2; \sim[m..]*T\}), \sim[..]*T) \quad \text{Equation (8)}$$

In the rules of equations (6) to (8) it should be understood that the false branch of the A(m) Conditional has been left unreduced for the sake of readability. Moreover, this expression should be reduced to eliminate any epsilon terms as discussed for True Match repeat rules of equations (4) and (5) above.

The final case to consider is that of True Match Repeat with both a lower and an upper bound specified: ~[M..N]*T. Now the semantics of the temporal language require that the m and n counters employed here are initialised simultaneously (this matters only if the expressions are not integer constants). This results in a four-way branch ~[M..N]*T=if (A(m), if (A(n-m), #1, #2), if (A(n-m), #3, #4))

where in the general case

1: is {T; ~[m..n]*T}
2: is {T; [m]*T}
3: is {T; ~[..n]*T}
4: is epsilon

The L(m) rule however is a two-way branch since n has already been initialised by the action associated with A(n-m), which tests N-M>0, to N-M-1:

~[m..n]*T=if (L(m), #1, #3)

(#1 and #3 as specified above). The special cases concerning nested Conditionals and epsilon terms can be inferred by direct analogy with the cases spelled out above.

With regard to the induction rules for First Match Repeat there is in fact little to add over an above the description of True Match Repeat. This is because the First Match Repeat is defined directly in terms of True Match and Chop:

{[M..N]*T1; T2}=fm {~[M..N]*T1; T2}

It is, however, helpful to observe that the semantics of the temporal language imply that, for example {[..n]*T1; T2}=fm (T2 or {T1; {[..n−1]*T1; T2}})

Either of these two approaches to defining the induction rules for the First Match Repeat operator suffice for the purposes of the Tableaux Construction procedure defined herein.

The present invention is optionally and more preferably able to represent non-finite expressions, such as those expressions containing repeats, with a finite structure if an unbounded number of counters are used in the structure. A number of special cases have been defined, for example for True Match repeats and First Match repeats. These cases are handled uniformly.

While the invention has been described with respect to a limited number of embodiments, it will be appreciated that many variations, modifications and other applications of the invention may be made.

What is claimed is:

1. A method for analyzing the temporal behavior of a system, the method comprising:

inputting a specification for the temporal behavior of a system in the form of a temporal expression;

parsing the temporal expression to form a hierarchical tree, each node of said hierarchical tree containing a subexpression of the temporal expression;

propagating a sampling event to each node of said hierarchical tree according to at least one Sampling rule;

forming a finite state machine by determining each transition from each node of said hierarchical tree to a successor node according to at least one transition Step rule to analyze the temporal expression;

providing the values of a plurality of variables of said system sampled over a period of time to said finite state machine;

evaluating the resulting state of said finite state machine to ascertain whether the resulting state comprises an error state; and providing an output indicating verification of a design of said system.

2. The method of claim 1, wherein said state machine is a deterministic state machine.

3. The method of claim 2, wherein said ascertaining comprises evaluating the temporal expression with said deterministic state machine.

4. The method of claim 1, wherein said system is the system of a DUT (device under test).

5. The method of claim 1, wherein said system comprises a concurrent, dynamic system.

6. The method of claim 5, wherein said concurrent dynamic system is selected from the group consisting of a telephone system, a switching network, and an embedded control software program.

7. The method of claim 1, wherein the temporal expression includes at least one expression containing at least one repeated subexpression and said state machine is constructed by representing said at least one expression as a finite structure having an unbounded number of counters for representing said at least one repeated subexpression.

8. The method of claim 1, wherein said propagating of said sampling event further comprises normalizing said hierarchical tree.

9. The method of claim 8, wherein normalizing said hierarchical tree includes removing at least one anomalous expression, wherein an anomalous expression is an expression equivalent to epsilon or empty.

10. The method of claim 9, wherein removing said at least one anomalous expression is performed recursively.

11. The method of claim 1, wherein the temporal expression is constructed in a temporal language and passing the temporal expression further comprises translating said temporal language into a plurality of functions, each function featuring an operator selected from a finite set of operators.

12. The method of claim 1, wherein said hierarchical tree has a root node and at least one leaf, and propagating said sampling event is performed iteratively starting from said root node.

13. The method of claim 12, wherein propagating said sampling event further comprises creating a new node for attaching said sampling event to said node, wherein said node is a successor node to said new node.

14. The method of claim 13, wherein creating said new node is performed if said sampling event is repeated at least once.

15. The method of claim 1, wherein propagating said sampling event further comprises reducing said hierarchical tree.

16. The method of claim 15, wherein hierarchical tree is reduced according to at least one rule, said rule being applied to said hierarchical tree recursively.

17. A computer-readable storage medium containing a set of instructions for analyzing the temporal behavior of a system, comprising:

a sample provision routine, for providing the values of a plurality of variables of said system sampled over a specified pattern in time;

an expression formation input routine, for forming inputting a temporal expression from said values specifying the temporal behavior of a system;

a parsing routine, for parsing the temporal expression to form a hierarchical tree, each node of said hierarchical tree containing a subexpression of the temporal expression;

a propagation routing, for propagating a sampling event to each node of said hierarchical tree according to at least one Sampling rule; and a transition determination state machine formation routine, for forming a finite state machine by determining each transition from each node of said hierarchical tree to a successor node according to at least one transition Step rule to analyze the temporal expression;

a sample provision routine, for providing the values of a plurality of variables of said system sampled over a period of time to said state machine; and a verification routine, for ascertaining whether said resulted in an error state of said finite state machine;

an output routine, for providing an output indicating verification of a design of said system.

* * * * *